(12) United States Patent
Yao et al.

(10) Patent No.: US 7,906,409 B2
(45) Date of Patent: Mar. 15, 2011

(54) DEVICE MANUFACTURING METHOD

(75) Inventors: Takafumi Yao, Miyagi-ken (JP); Meoung-Whan Cho, Miyagi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 184 days.

(21) Appl. No.: 12/405,696

(22) Filed: Mar. 17, 2009

(65) Prior Publication Data
US 2009/0239356 A1 Sep. 24, 2009

(30) Foreign Application Priority Data
Mar. 19, 2008 (JP) .................. 2008-072199

(51) Int. Cl.
*H01L 21/00* (2006.01)
(52) U.S. Cl. .................. 438/458; 438/478; 257/352
(58) Field of Classification Search .......... None
See application file for complete search history.

(56) References Cited

U.S. PATENT DOCUMENTS

| | | | | |
|---|---|---|---|---|
| 6,489,221 | B2 * | 12/2002 | Gehrke et al. | 438/479 |
| 7,829,435 | B2 * | 11/2010 | Yao et al. | 438/458 |
| 2008/0261378 | A1 * | 10/2008 | Yao et al. | 438/458 |
| 2009/0020768 | A1 * | 1/2009 | Butcher et al. | 257/88 |
| 2010/0120234 | A1 * | 5/2010 | Yao et al. | 438/478 |

FOREIGN PATENT DOCUMENTS
JP 63-188983 8/1988
WO 2006-126330 A1 11/2006

OTHER PUBLICATIONS

Lateral epitaxy of low defect density GaN layers via organometallic vapor phase epitaxy, Ok-Hyum Nam; Michael D. Bremser, Tsvetanka S. Zheleva, and Robert F. Davis; Appl. Phys. Lett. 71 (18)/2638-2640; Nov. 3, 1997.

Room-Temperature Continuous-Wave Operation of InGaN Multi-Quantum-Well Laser Diodes Grown on an n-GaN Substrate with a Backside n-Contact; Masaru Kuramoto, Chiaki Sasaoka, Yukihiro Hisanaga, Akitaka Kimura, A. Atsushi Yamaguchi, Haruo Sunakawa, Naotaka Kuroda, Masaaki Nido, Akira Usui, and Masashi Mizuta; Jpn. J. Appl. Phys., vol. 38 (1999); pp. L184-L186.

MRS Internet Journal, Nitride Semiconductor Research; vol. 4S1; G3.38 Pendeo-Epitaxy—A New Approach for Lateral Growth of GaN Structures; Tsvetanka S. Zheleva; Scott A. Smith, Darren B. Thomson, Thomas Gehrke, Kevin J. Linthicum, Pradeep Rajagopal, Eric Carlson, Waeil M. Ashmawi, Robert F. Davis; 1999.

* cited by examiner

*Primary Examiner* — Jarrett J Stark
*Assistant Examiner* — Nicholas Tobergte
(74) *Attorney, Agent, or Firm* — Cowan, Liebowitz & Latman P.C.

(57) ABSTRACT

A device manufacturing method includes a buffer layer forming step of forming a buffer layer on an underlying substrate, a mask pattern forming step of forming, on the buffer layer, a mask pattern which partially covers the buffer layer, a growth step of growing a group III nitride crystal from regions exposed by the mask pattern on the surface of the buffer layer, thereby forming a structure in which a plurality of crystal members are arranged with gaps therebetween so as to partially cover the buffer layer and the mask pattern, a channel forming step of forming a channel, to supply a second etchant for the buffer layer to the buffer layer, by selectively etching the mask pattern using a first etchant for the mask pattern, and a separation step of separating the plurality of crystal members from the underlying substrate and separating the plurality of crystal members from each other by supplying the second etchant to the buffer layer through the gaps and the channel and selectively etching the buffer layer.

13 Claims, 18 Drawing Sheets

DEVICE MANUFACTURING METHOD

BACKGROUND OF THE INVENTION

1. Field of the Invention

The present invention relates to a device manufacturing method.

2. Description of the Related Art

An electronic device such as an LED (Light Emitting Diode) is often formed on a gallium nitride crystal member. To improve the properties of the electronic device, it is necessary to improve the crystallinity of the gallium nitride crystal member. To improve the crystallinity of the gallium nitride crystal member, it is a common practice to form a low-temperature buffer layer on an underlying substrate and then to form a gallium nitride crystal member on the low-temperature buffer layer, instead of directly forming a gallium nitride crystal member on an underlying substrate (see Japanese Patent Laid-Open No. 63-188983). The low-temperature buffer layer is a layer obtained by growing gallium nitride at a temperature lower than that at which a gallium nitride crystal member is formed.

The underlying substrate generally contains a crystal of sapphire. In this case, a lattice mismatch and a difference in thermal expansion between the underlying substrate (sapphire) and the low-temperature buffer layer (gallium nitride) are large. This often generates a dislocation or an internal stress in the low-temperature buffer layer grown on the underlying substrate, so the crystallinity of the gallium nitride crystal member grown on the low-temperature buffer layer may not improve.

In recent years, growth techniques such as ELO (see Appl. Phys. Lett. 71(18)2638 (1997)), FIELO (see Jpn. J. Appl. Phys. 38, L184 (1999)), and pendeo-epitaxy (see MRS Internet J. Nitride Semicond. Res. 4S1, G3.38(1999)) have already been developed to decrease the density of defects caused by a lattice mismatch between the underlying substrate (sapphire) and the low-temperature buffer layer (gallium nitride). However, these techniques have not yet satisfactorily improved the crystallinity of the gallium nitride crystal body grown on the low-temperature buffer layer.

A technique that reduces a lattice mismatch and a difference in thermal expansion coefficient between the underlying substrate (sapphire) and the low-temperature buffer layer (gallium nitride) is in demand.

To meet this demand, the inventor of the present invention has proposed a technique of forming a chromium layer on an underlying substrate and nitriding the chromium layer, thereby forming a chromium nitride buffer layer (see the pamphlet of International Publication WO 2006/126330). The technique disclosed in the pamphlet of International Publication WO 2006/126330 forms a structure including "an underlying substrate/chromium nitride buffer layer/initial growth layer/GaN single-crystal layer". In this structure, the lattice spacing of the chromium nitride buffer layer has a value between those of the underlying substrate (sapphire) and initial growth layer (gallium nitride). The thermal expansion coefficient of the chromium nitride buffer layer has a value between those of the underlying substrate (sapphire) and initial growth layer (gallium nitride).

The technique disclosed in the pamphlet of International Publication WO 2006/126330 further forms a bonding layer and a conductive substrate on the GaN single-crystal layer to form a structure including "an underlying substrate/chromium nitride buffer layer (peeling buffer layer)/initial growth layer/GaN single-crystal layer/bonding layer/conductive substrate". The portion from the underlying substrate to the GaN single-crystal layer in this structure is scribed in a grid pattern when viewed from above to form a structure in which a plurality of stacked bodies each including "an underlying substrate/chromium nitride buffer layer (peeling buffer layer)/initial growth layer/GaN single-crystal layer" are arranged with gaps between them. This patent reference also discloses a technique of etching, by using a chemical solution (etchant), the peeling buffer layer of chromium nitride formed between the underlying substrate and the initial growth layer in each of the plurality of stacked bodies, thereby separating the gallium nitride single-crystal layer and the initial growth layer from the underlying substrate with a chip size. This makes it possible to obtain a chip-size device including the gallium nitride crystal body and the initial growth layer.

The throughput in manufacturing a device can be improved by shortening the etching time of the peeling buffer layer of chromium nitride.

The pamphlet of International Publication WO 2006/126330 does not disclose how to shorten the etching time of the peeling buffer layer of chromium nitride, although the pamphlet discloses a technique of etching the peeling buffer layer of chromium nitride by an etchant to separate the gallium nitride crystal body and the initial growth layer from the underlying substrate. A method that shortens the etching time of the peeling buffer layer of chromium nitride is in demand.

SUMMARY OF THE INVENTION

It is an aim of the present invention to shorten the etching time of a peeling buffer layer in manufacturing a device made of a group III nitride crystal member.

According to the first aspect of the present invention, there is provided a device manufacturing method comprising: a peeling buffer layer forming step of forming a peeling buffer layer on an underlying substrate; a mask pattern forming step of forming, on the peeling buffer layer, a mask pattern which partially covers the peeling buffer layer; a growth step of growing a group III nitride crystal from regions exposed by the mask pattern on a surface of the peeling buffer layer, thereby forming a structure in which a plurality of crystal members are arranged with gaps therebetween so as to partially cover the peeling buffer layer and the mask pattern; a channel forming step of forming a channel, to supply a second etchant for the peeling buffer layer to the peeling buffer layer, by selectively etching the mask pattern using a first etchant for the mask pattern; and a separation step of separating the plurality of crystal members from the underlying substrate and separating the plurality of crystal members from each other by supplying the second etchant to the peeling buffer layer through the gaps and the channel and selectively etching the peeling buffer layer.

According to the second aspect of the present invention, in the device manufacturing method according to the first aspect of the present invention, there is provided a device manufacturing method wherein, in the mask pattern forming step, the mask pattern is formed so as to partially cover regions in which the plurality of crystal members are to be formed, and in the channel forming step, the channel is formed so that at least a part of the channel extends between the peeling buffer layer and each of the plurality of crystal members.

According to the third aspect of the present invention, in the device manufacturing method according to the first or second aspect of the present invention, there is provided a device manufacturing method wherein, in the growth step, the structure is formed by growing the plurality of crystal members with the gaps therebetween from the regions exposed by the mask pattern on the surface of the peeling buffer layer.

According to the fourth aspect of the present invention, in the device manufacturing method according to the first or second aspect of the present invention, there is provided a device manufacturing method wherein the growth step includes steps of growing a group III nitride crystal layer to be formed into the plurality of crystal members from the regions, which are exposed by the mask pattern on the surface of the peeling buffer layer, so as to cover the peeling buffer layer and the mask pattern, and forming the structure by selectively removing a part of the crystal layer so as to form the gaps.

According to the fifth aspect of the present invention, in the device manufacturing method according to any one of the first to fourth aspects of the present invention, there is provided a device manufacturing method further comprising, between the mask pattern forming step and the growth step, a nitridation step of nitriding the regions exposed by the mask pattern on the surface of the peeling buffer layer, thereby partially changing the peeling buffer layer to a second peeling buffer layer, wherein the peeling buffer layer contains a metal, the second peeling buffer layer contains a metal nitride, and in the separation step, the plurality of crystal members are separated from the underlying substrate by supplying the second etchant to the peeling buffer layer and the second peeling buffer layer through the gaps and the channel, and selectively etching the peeling buffer layer and the second peeling buffer layer.

According to the sixth aspect of the present invention, in the device manufacturing method according to the fifth aspect of the present invention, there is provided a device manufacturing method wherein an etching rate of the mask pattern for the first etchant is higher than etching rates of the underlying substrate, the peeling buffer layer, the second peeling buffer layer, and the crystal member for the first etchant, and etching rates of the peeling buffer layer and the second peeling buffer layer for the second etchant are higher than etching rates of the underlying substrate and the crystal member for the second etchant.

According to the seventh aspect of the present invention, in the device manufacturing method according to any one of the first to fourth aspects of the present invention, there is provided a device manufacturing method wherein, in the peeling buffer layer forming step, a metal layer is formed on the underlying substrate before the mask pattern forming step, and the metal layer is nitrided to form the peeling buffer layer of a metal nitride.

According to the eighth aspect of the present invention, in the device manufacturing method according to any one of the first to fourth aspects of the present invention, there is provided a device manufacturing method wherein the peeling buffer layer forming step includes a metal layer forming step of forming a metal layer on the underlying substrate, and a nitridation step of nitriding the metal layer to form the peeling buffer layer of a metal nitride.

According to the ninth aspect of the present invention, in the device manufacturing method according to the seventh or eighth aspect of the present invention, there is provided a device manufacturing method wherein an etching rate of the mask pattern for the first etchant is higher than etching rates of the underlying substrate, the peeling buffer layer, and the crystal member for the first etchant, and an etching rate of the peeling buffer layer for the second etchant is higher than etching rates of the underlying substrate and the crystal member for the second etchant.

According to the 10$^{th}$ aspect of the present invention, in the device manufacturing method according to the first to ninth aspects of the present invention, there is provided a device manufacturing method further comprising, between the growth step and the channel forming step, a burying step of burying the gaps with a burying substance, wherein in the channel forming step, the burying substance is selectively etched to re-form the gaps to supply an etchant for the peeling buffer layer.

According to the 11$^{th}$ aspect of the present invention, in the device manufacturing method according to the 10$^{th}$ aspect of the present invention, there is provided a device manufacturing method wherein an etching rate of the burying substance for the first etchant is higher than etching rates of the underlying substrate, the peeling buffer layer, and the crystal member for the first etchant.

According to the 12$^{th}$ aspect of the present invention, in the device manufacturing method according to the third aspect of the present invention, there is provided a device manufacturing method further comprising, between the growth step and the channel forming step, an etching step of etching ends of each of the plurality of crystal members.

According to the 13$^{th}$ aspect of the present invention, in the device manufacturing method according to any one of the first to 12$^{th}$ aspects of the present invention, there is provided a device manufacturing method further comprising, between the growth step and the separation step, a step of forming a bonding layer on the structure and forming a reinforcing layer on the bonding layer, wherein, in the separation step, the plurality of crystal members are separated from the underlying substrate and separated from each other by removing the bonding layer and the reinforcing layer after selectively etching the peeling buffer layer.

According to the present invention, it is possible to shorten the etching time of a peeling buffer layer in manufacturing a device made of a group III nitride crystal member.

Further features of the present invention will become apparent from the following description of exemplary embodiments with reference to the attached drawings.

DESCRIPTION OF THE EMBODIMENTS

Figure 1:
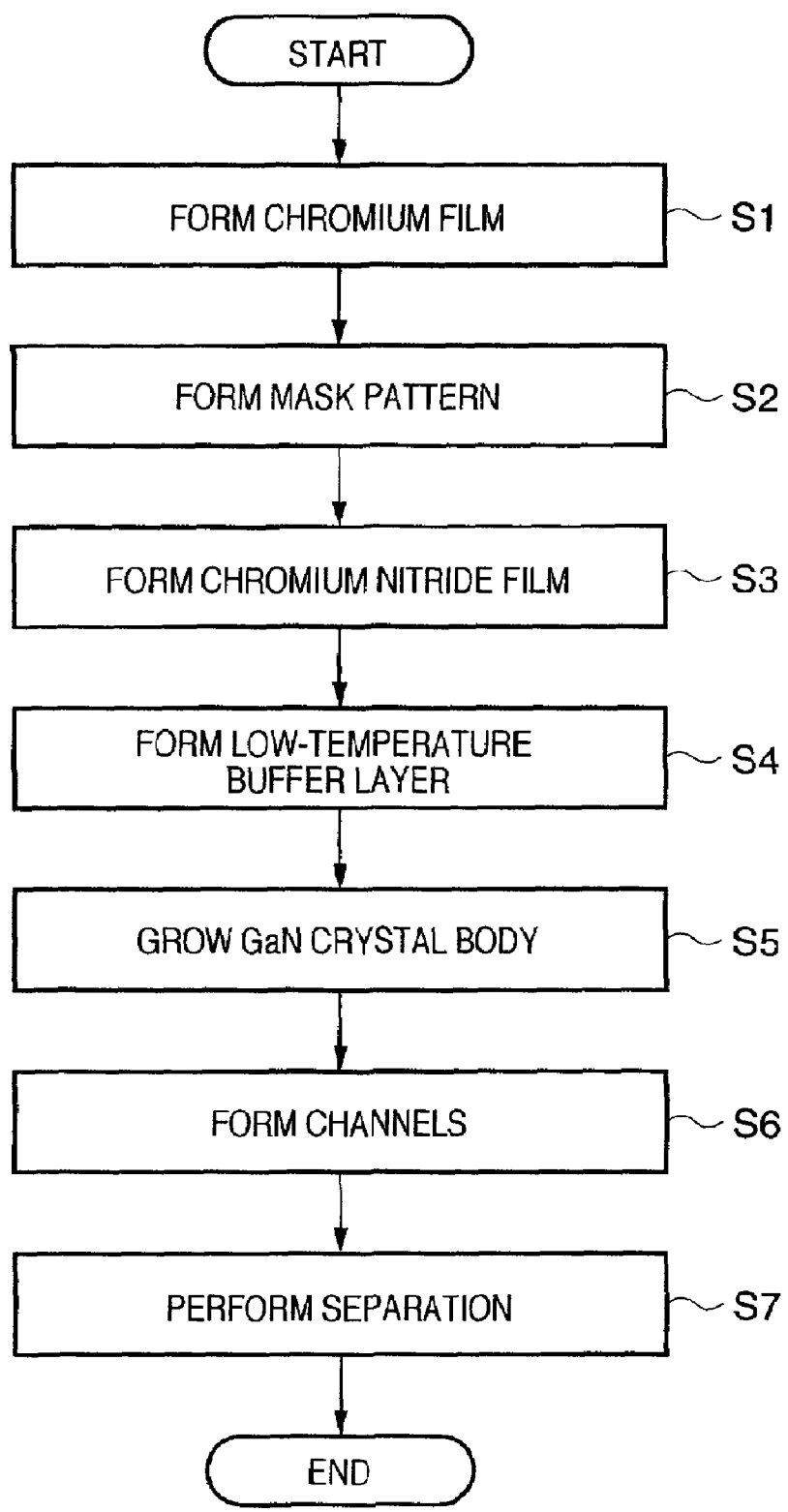
FIG. 1 is a flowchart illustrating a device manufacturing method according to the first embodiment of the present invention.

A device manufacturing method according to the first embodiment of the present invention will be described with reference to FIGS. 1 to 11. FIG. 1 is a flowchart illustrating the device manufacturing method according to the first embodiment of the present invention. FIGS. 2 and 4 to 11 are sectional views showing the steps of the device manufacturing method according to the first embodiment of the present invention. FIGS. 3A and 3B are views showing the shape of the upper surface of a mask pattern formed in the step of FIG. 2B. FIG. 3C is a sectional view along a B-B' line of FIG. 3B. FIGS. 2 and 4 to 11 are sectional views each corresponding to a sectional view along an A-A' line of FIG. 3A.

It should be noted that GaN will be exemplified below as a group III nitride serving as the material of a substrate to be manufactured. The GaN crystal member is suited to a so-called vertical device in which an electric current flows through a substrate itself because it is easy for this member to attain a low resistance.

In step S1 of FIG. 1, an underlying substrate 10 is prepared. The underlying substrate 10 is made of, for example, a single crystal of sapphire. An upper surface 10a of the underlying substrate 10 is the (0001) plane of the single crystal of sapphire.

Note that an underlying substrate may be made of a material other than sapphire as long as it has a crystal structure of one of the hexagonal system, the pseudo-hexagonal system, or the cubic system. Note also that, when an underlying substrate is made of a material having a crystal structure of the cubic system, the (111) plane of the crystal is used as the upper surface of the underlying substrate in the following description.

Figure 2A:
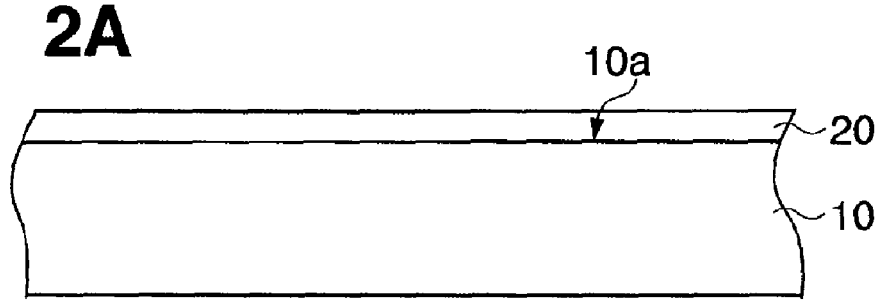
FIGS. 2A to 2C are sectional views showing the steps of the device manufacturing method according to the first embodiment of the present invention.
Figure 3A:
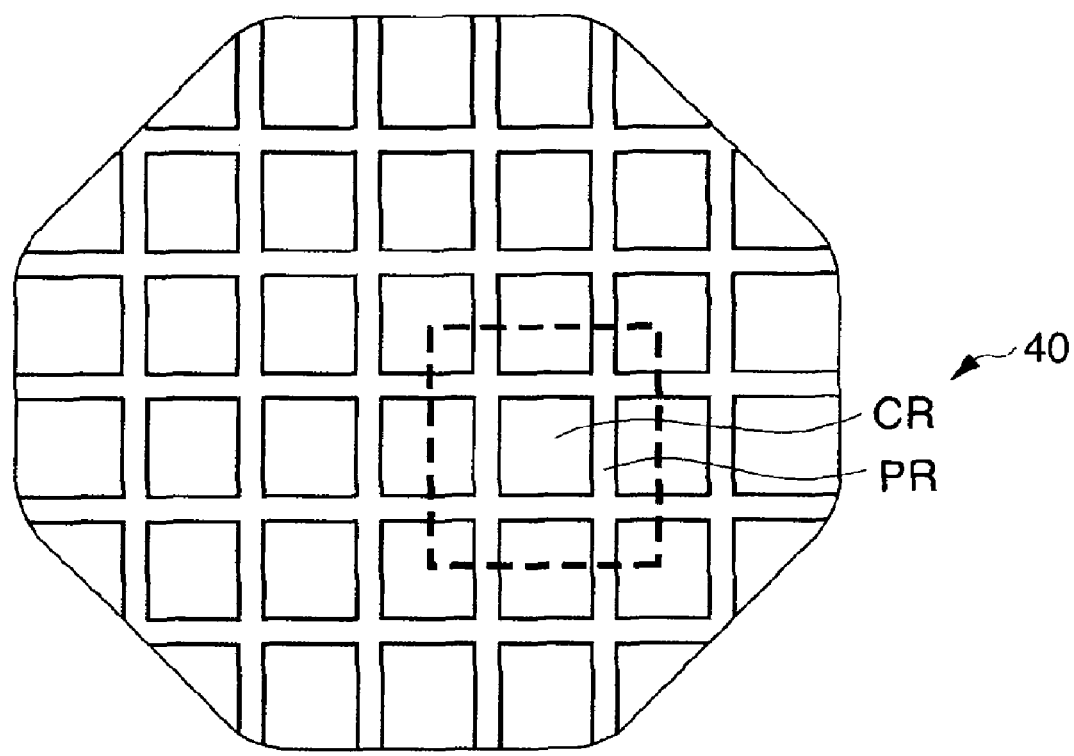
FIGS. 3A and 3B are views showing the shape of the upper surface of a mask pattern formed in the step of FIG. 2B.
Figure 3B:
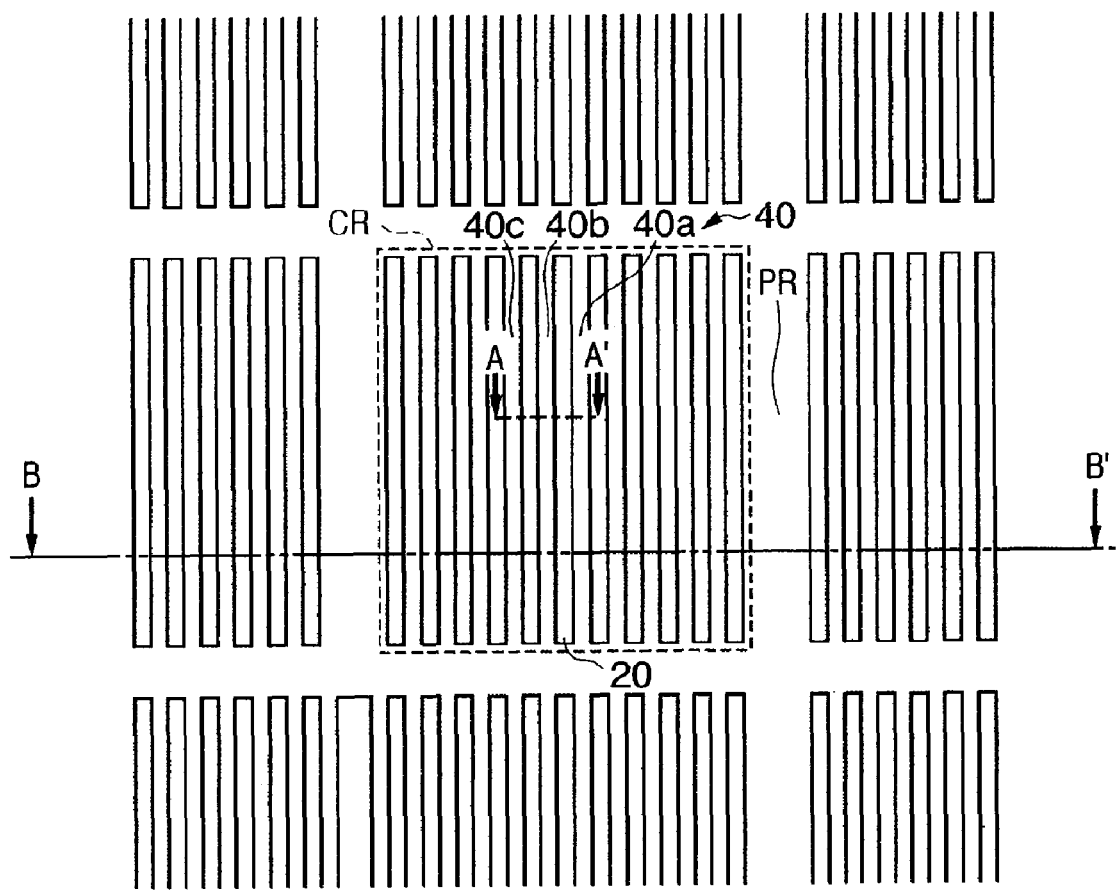
Figure 3C:
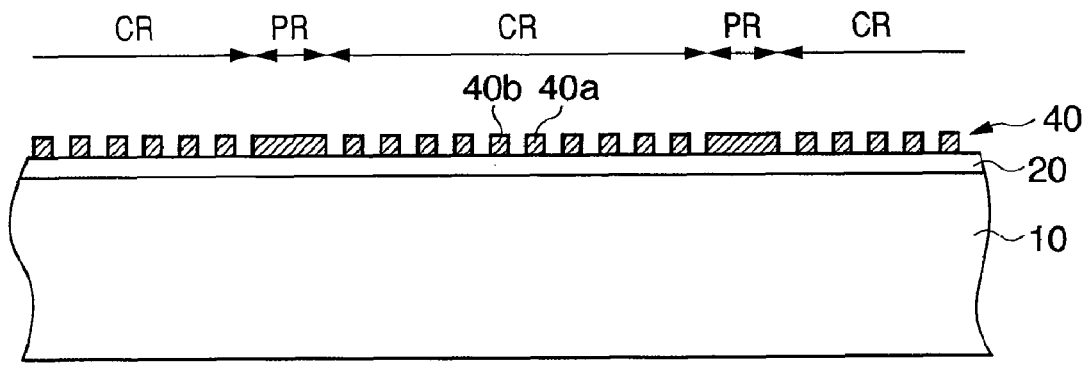
FIG. 3C is a sectional view along an A-A' line of FIG. 3B.

A chromium film (peeling buffer layer) 20 is formed on the underlying substrate 10 (see FIG. 2A). For example, a substrate made of a crystal of sapphire is prepared as an underlying substrate 10. A chromium film 20 is formed on the upper surface of the underlying substrate 10, that is, formed on the (0001) plane of the crystal of sapphire.

More specifically, first, an underlying substrate 10 is cleaned by a general semiconductor substrate cleaning method (degreasing by organic cleaning, and contaminant/particle removal by acid/alkali/pure water cleaning) to ensure the cleanliness of an upper surface 10a. Next, a Cr metal film is formed on the upper surface 10a, which ensures its cleanliness, in an atmosphere of an inert gas (e.g., Ar gas) by sputtering to form a chromium film 20.

In step S2 of FIG. 1, a mask pattern 40 which partially covers the chromium film 20 is formed on the chromium film 20.

More specifically, a mask layer (not shown) to serve as a mask pattern 40 is formed on the chromium film 20 by, for example, vapor deposition. For instance, a $SiO_2$ mask layer is formed on the chromium film 20 using silane gas and laughter gas ($N_2O$) by plasma CVD while the temperature of the underlying substrate 10 is set to 350° C. An example of the thickness of the mask layer is 300 nm.

A mask layer to be patterned into a mask pattern 40 may be formed by, for example, thermal CVD, sputtering, or the spin-on method.

Figure 2B:
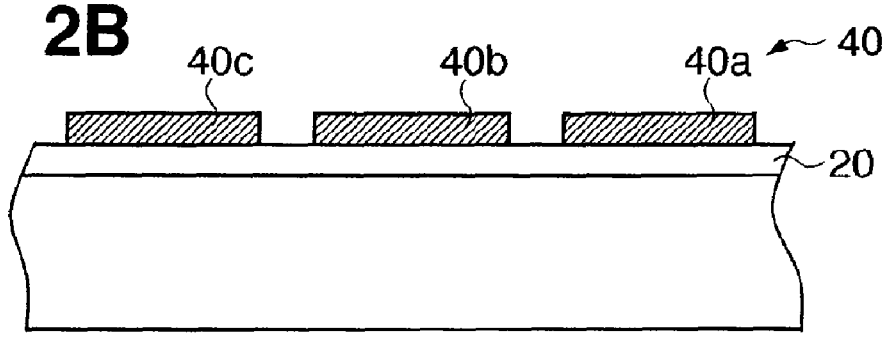

The mask layer is patterned by, for example, photolithography to form a mask pattern 40 (see FIG. 2B). The mask pattern 40 includes a plurality of chip regions CR and a peripheral region PR, as shown in FIG. 3A. The plurality of chip regions CR are arrayed in the row and column directions. The peripheral region PR partitions the plurality of chip regions CR in a grid pattern. The chip region CR has a line shape when viewed from above, and includes a plurality of line portions 40a, 40b, 40c, . . . , as shown in FIG. 3B. The plurality of line portions 40a, 40b, 40c, . . . each have, for example, a width of 3 μm and an clearance of 12 μm. That is, a mask pattern 40 is formed so as to partially cover regions (the chip regions CR) in which a plurality of crystal members 60 (to be described later) are formed. Note that FIG. 3B is an enlarged view of a portion indicated by a broken line in FIG. 3A.

Because the start point of etching of the mask pattern 40 in step S6 (to be described later) lies at the edge of the underlying substrate 10, at least one end of the peripheral region PR in the mask pattern 40 preferably continuously extends up to the edge of the underlying substrate 10. In addition, at least one end of each of the line portions 40a, 40b, 40c, . . . in the chip region CR of the mask pattern 40 preferably intersects with the peripheral region PR. The width of the portion sandwiched between two chip regions CR in the peripheral region PR in the mask pattern 40 (see FIG. 3C) is determined so that a structure ST grows intact in step S5 (to be described later).

The width of the portion sandwiched between two chip regions CR in the peripheral region PR of the mask pattern 40 (see FIG. 3C) may be determined as a value necessary to etch or scribe the crystal layer grown in step S5 (to be described later). FIG. 3C is a sectional view taken along a line B-B' in FIG. 3B.

A thickness t of the mask pattern 40 in the chip region CR is preferably 0.05 to 1.0 μm and, more preferably, 0.1 to 0.5 μm. The thickness t is preferably large in order to shorten the etching time of the peeling buffer layer. However, if the thickness t is too large, the film often peels off upon nitridation or growth.

The line portions 40a, . . . , each having a line shape in the chip region CR, preferably run along the [1-100] direction of the underlying substrate 10 (preferably with a deviation that falls within ±3°). If the line portions 40a, . . . run in the [1-100] direction of the underlying substrate 10, a GaN crystal member (to be described later) easily merges while its crystal orientations are uniform as it grows from the two sides of each of the line portions 40a, . . . onto them sideways, as compared to a case in which the line portions 40a, . . . run in other directions.

A width w of each of the line portions 40a, ... in the chip region CR is preferably 1 to 10 μm. If the width w is smaller than 1 μm, it is difficult to form line portions by a relatively simple patterning process such as photolithography. In addition, the rate of etchant permeation is slow, resulting in prolongation of the etching time in that case. If the width w is greater than or equal to 10 μm, a GaN crystal member (to be described later) is hard to merge while its crystal orientations are uniform as it grows from the two sides of each of the line portions 40a, ... onto them sideways. Also, the width of the peripheral region PR is preferably 50 μm.

An clearance p between the line portions 40a, ... is preferably 1 to 20 μm. If the clearance p is smaller than 1 μm, it is difficult to form line portions by a relatively simple patterning process such as photolithography. If the interval p is larger than 20 μm, the width (or area) of the peeling buffer layer under the line portions is so large that the distance by which the etchant permeates the layer in a direction perpendicular to the side surfaces of the line portions is large, resulting in prolongation of the etching time.

The mask pattern 40 is preferably made of an amorphous material because its selective growth and selective etching are relatively easy. The material of the mask pattern 40 is preferably an oxide or nitride which does not contain the same group III element as that contained in the group III nitride crystal member. When the group III nitride crystal member contains Ga, Al, or In as the group III element, the material of the mask pattern 40 preferably contains at least one of $SiO_2$, $SiN_x$, $SiO_xN_y$, Si, or a mixture thereof.

The shape of the chip region CR in the mask pattern 40 when viewed from above may be a shape other than a line shape. The shape of the mask pattern 40 when viewed from above may be, for example, a dot shape, hexagonal shape, or crossing shape. The sectional shape of the mask pattern 40 may be an inverted mesa shape. This is because an inverted mesa shape can effectively increase the sectional area of a path to supply an etchant, thus easily shortening the etching time of the peeling buffer layer, as compared to an erected mesa shape. In both these cases, because the start point of etching of the mask pattern 40 in step S6 (to be described later) lies at the edge of the underlying substrate 10, at least one end of the peripheral region PR in the mask pattern 40 preferably continuously extends up to the edge of the underlying substrate 10. In addition, at least one end of each of the line portions 40a, 40b, 40c, ... in the chip region CR of the mask pattern 40 preferably intersects with the peripheral region PR.

In step S3 of FIG. 1, regions exposed by the mask pattern 40 on the surface of the chromium film 20 are nitrided to partially change the chromium film 20 into a chromium nitride film (another peeling buffer layer) 30.

More specifically, the sample, having undergone step S2 in FIG. 1, is transported to a growth device for growing a GaN crystal, and undergoes a nitridation process.

Figure 2C:
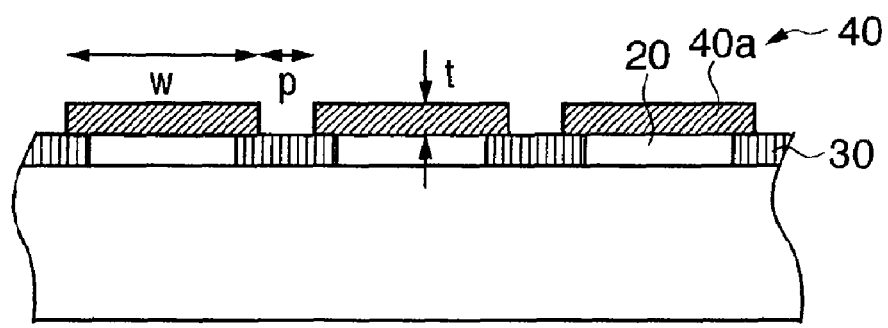

The sample undergoes a thermal nitridation process in an atmosphere of a reducing gas containing nitrogen to nitride the chromium film 20 near the regions exposed by the mask pattern 40 to a chromium nitride film 30 (see FIG. 2C). This reducing gas containing nitrogen preferably contains at least one of ammonia or hydrazine. At this time, the heating temperature of the underlying substrate 10 is preferably more than 1,000° C. (inclusive) (i.e. 1,273K (inclusive)) and less than 1,300° C. (inclusive) from the viewpoint of improving the crystallinity of the chromium nitride film 30.

For example, when the underlying substrate 10 contains aluminum, nitridation at a heating temperature of more than 1,000° C. (inclusive) and less than 1,300° C. (inclusive) diffuses Al and N atoms from the underlying substrate 10 and the chromium nitride film 30, respectively. With this operation, an intermediate layer (not shown) containing aluminum nitride is formed between the underlying substrate 10 and the chromium nitride film 30. The intermediate layer is thought to assist in re-arranging the chromium nitride film 30 while its crystal lattices are uniformly oriented in a specific direction with respect to the underlying substrate 10. In one example of the thermal nitridation process, the heating temperature of the underlying substrate 10 is, for instance, 1,080° C.

The average film thickness of the chromium nitride film 30 preferably falls within the range of more than 10 nm (inclusive) and less than 68 nm (inclusive) from the viewpoint of improving the crystallinity of the chromium nitride film 30. The average film thickness of the chromium nitride film 30 can be calculated by measuring its unevenness by a cross-section TEM, and was confirmed to be 1.5 times that of the chromium film 20 before nitridation.

If the average film thickness of the chromium nitride film 30 is smaller than 10 nm, that is, the thickness of the chromium film is smaller than 7 nm, the upper surface 10a of the underlying substrate 10 is often partially exposed. In this case, a GaN initial growth layer starts to grow from both the underlying substrate 10 and the chromium nitride film 30 in GaN epitaxial growth (to be described later). When this occurs, the crystallinity may not improve in the step of FIG. 6A (to be described later), or a large number of pits may be formed in the surface of the GaN, after crystal growth, in the step of FIG. 6A (to be described later) because the crystal orientation differs between the GaN initial growth layer grown from the underlying substrate 10 and that grown from the chromium nitride film 30. Also, if the average film thickness of the chromium nitride film 30 is larger than 68 nm, the chromium nitride film 30 is likely to be polycrystalline as solid-phase epitaxial growth of the chromium nitride film 30 does not uniformly progress on the underlying substrate 10 in the above-mentioned thermal nitridation process. When this occurs, GaN which grows on the chromium nitride film 30 in the step of FIG. 6A (to be described later) becomes a mosaic crystal or a polycrystal, and the crystallinity may not improve in GaN epitaxial growth (to be described later).

Figure 4:
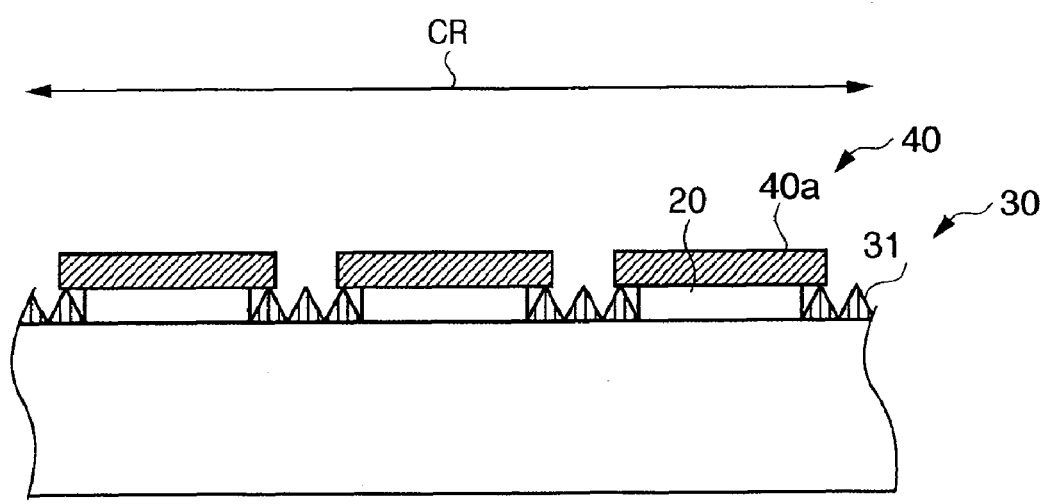
FIG. 4 is a sectional view showing the step of the device manufacturing method according to the first embodiment of the present invention.

A chromium nitride film 30 may be formed as a plurality of pyramidal microcrystals 31 which continuously align themselves in the lateral direction, as shown in FIG. 4.

In step S4 of FIG. 1, an initial growth layer 50 is grown on the chromium nitride film 30.

For example, an initial growth layer 50 having a thickness of 5 μm is formed by HVPE in a growth device while the temperature of the underlying substrate 10 is set to 900° C. (see FIGS. 5A to 5C).

When an initial growth layer 50 is grown on the chromium nitride film 30 formed as a plurality of pyramidal microcrystals 31 (see FIG. 4) which continuously align themselves in the lateral direction, it can be grown so as to have a flat surface. The initial growth layer 50 is thought to easily grow at a relatively high growth temperature (900° C.) when the microcrystals 31 are present in its vicinity.

Assume that an initial growth layer is directly grown on the sapphire substrate without forming a chromium nitride film 30. In this case, an initial growth layer cannot grow so as to have a flat surface as nucleation on the surface of the sapphire substrate fails even at a relatively high growth temperature (900° C.).

Figure 5A:
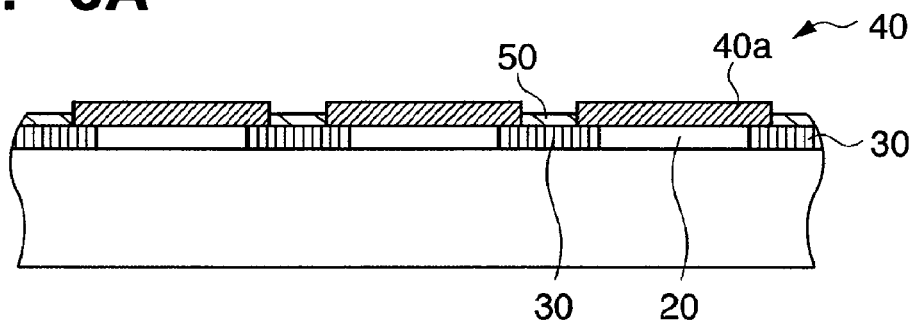
FIGS. 5A to 5C are sectional views showing the steps of the device manufacturing method according to the first embodiment of the present invention.
Figure 5B:
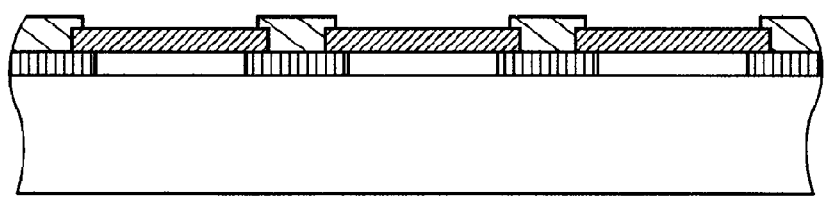
Figure 5C:
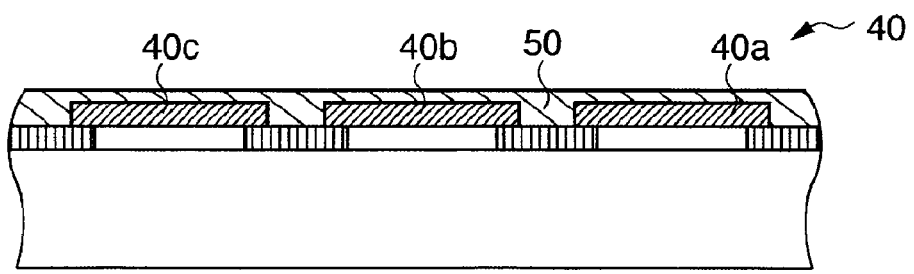

The thickness of the initial growth layer 50 may be smaller than that of the mask pattern 40 (see FIG. 5A), may be larger than that of the mask pattern 40 and be small enough not to merge the initial growth layer 50 in the lateral direction (see FIG. 5B), or may be larger than that of the mask pattern 40 and be large enough to merge the initial growth layer 50 in the lateral direction (see FIG. 5C).

As mentioned above, the crystallinity of chromium nitride film 30 is good. Hence, in the cases of FIGS. 5A and 5B, a crystal of the initial growth layer 50 grows with a good crystallinity. In the case of FIG. 5C, the initial growth layer 50 merges while its crystal orientations are uniform as it grows from the two sides of each of the line portions 40a, . . . onto them sideways.

In step S5 of FIG. 1, a group III nitride crystal is grown from the regions exposed by the mask pattern 40 on the surface of the chromium nitride film 30 (see FIGS. 3A to 3C) to form a structure ST (see FIG. 9A) in which a plurality of crystal members 60 are arranged with gaps 80 between them so as to partially cover the chromium nitride film 30 and the mask pattern 40. That is, the width of the portion sandwiched between two chip regions CR in the peripheral region PR of the mask pattern 40 is determined so that a structure ST grows intact. Accordingly, a plurality of crystal members 60 grow from the regions, which are exposed by the mask pattern 40 on the surface of the chromium nitride film 30, with gaps 80 between them to form a structure ST. Also, an electrode 90 is formed on the upper surface of the crystal member 60.

For example, a group III nitride crystal member 60 having a thickness of 500 μm is formed by HVPE in a growth device while the V/III ratio is set to 25 and the temperature of the underlying substrate 10 is set to 1,040° C. (see FIGS. 6A to 6C). To obtain a chip from the crystal member, its thickness is preferably greater than or equal to 3 μm.

The thickness of the initial growth layer 50 is, for example, several micrometers to about 10 μm.

Figure 6A:
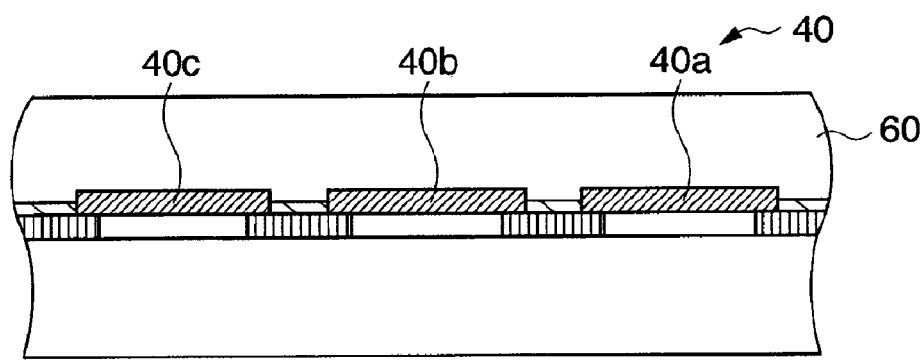
FIGS. 6A to 6C are sectional views showing the steps of the device manufacturing method according to the first embodiment of the present invention.
Figure 6B:
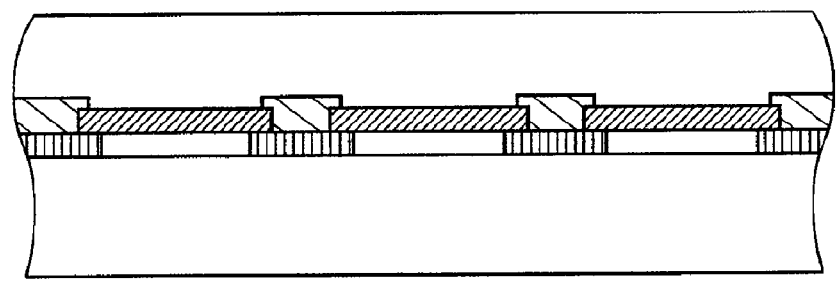
Figure 6C:
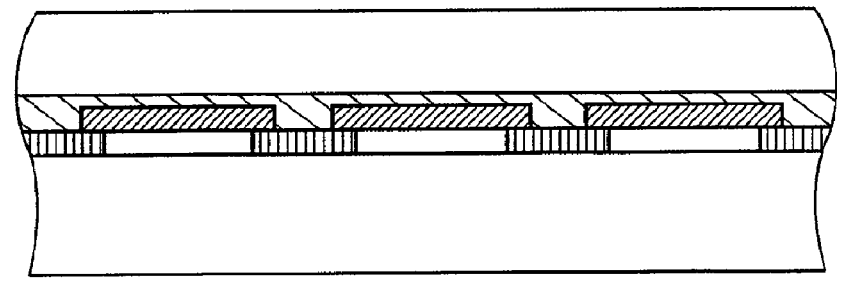

As mentioned above, the crystallinity of the initial growth layer 50 is good. Hence, in the cases of FIGS. 6A and 6B, the crystal member 60 merges while its crystal orientations are uniform as it grows from the two sides of each of the line portions 40a, . . . onto them sideways. In the case of FIG. 6C, a crystal of the crystal member 60 grows with a good crystallinity. When a group III nitride crystal member 60 is formed while the temperature of the underlying substrate 10 is set to more than 1,040° C., for example, 1,080° C., it more easily merges.

The width of the portion sandwiched between two chip regions CR in the peripheral region PR of the mask pattern 40 (see FIG. 3C) may be determined as a value necessary to etch or scribe the crystal layer grown in step S5. In this case, in step S5, a group III nitride crystal layer (not shown) to serve as a plurality of crystal members 60 may be grown so as to cover the chromium nitride film 30 and the mask pattern 40 from the regions exposed by the mask pattern 40 on the surface of the chromium nitride film 30. In this case, a three-dimensional structure according to the mask pattern 40 is formed on the upper surface of the crystal layer. After that, a part (a portion corresponding to the peripheral region PR in the mask pattern 40) of the crystal layer is selectively removed so as to form gaps 80 (see FIG. 9A) in accordance with the three-dimensional structure of the upper surface of the crystal layer (without planarizing it), thereby forming a structure ST. This part of the crystal layer may be removed by scribing or etching. In this manner, a structure ST can be formed by determining the width of the portion sandwiched between two chip regions CR in the peripheral region PR of the mask pattern 40 as a value that is less than or equal to that which allows a structure ST to grow intact and that which is necessary for etching or scribing. This makes it possible to improve the number (yield) of chips obtained from one underlying substrate 10.

Figure 9A:
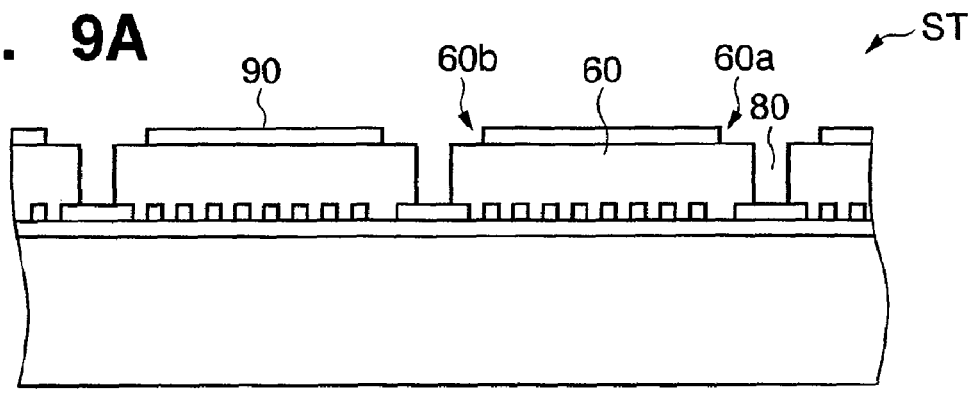
FIGS. 9A to 9D are sectional views showing the steps of the device manufacturing method according to the first embodiment of the present invention.
Figure 9B:
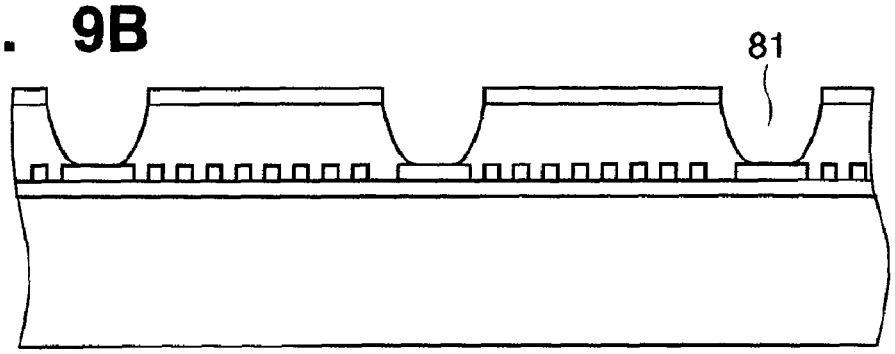
Figure 9C:
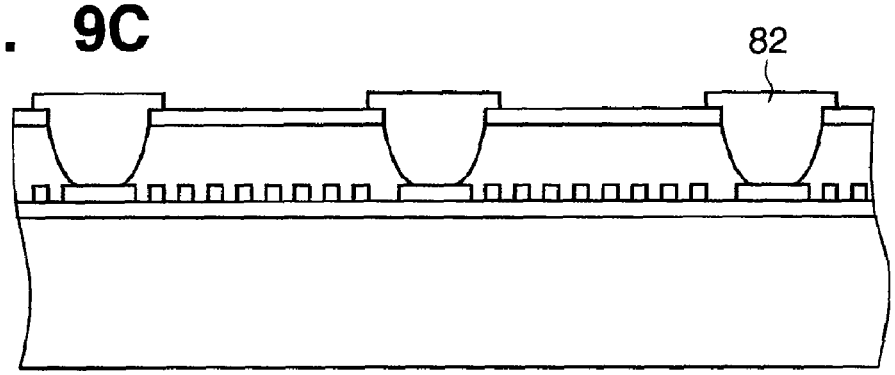
Figure 9D:
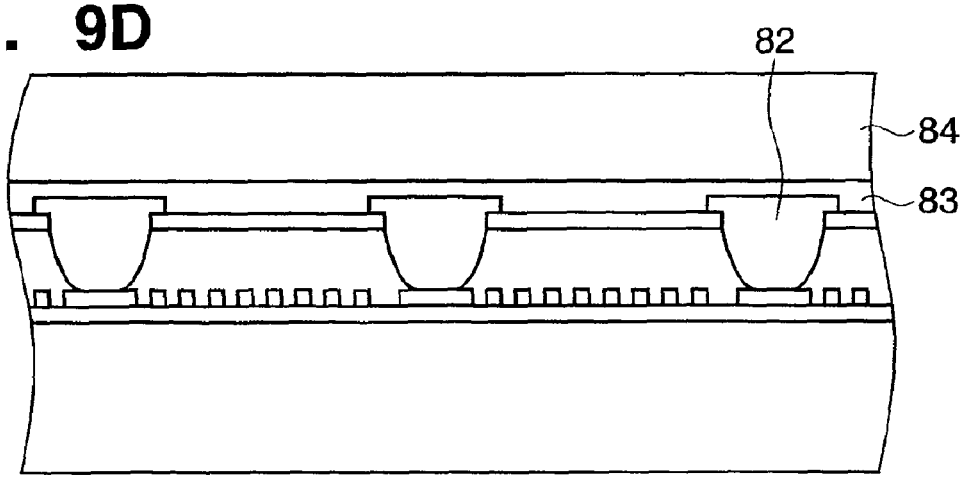

Ends 60a and 60b of each of the plurality of crystal members 60 are etched (see FIG. 9B). With this operation, gaps 81 having an upper width larger than their lower width are formed.

The gaps 81 are filled with a burying substance 82 by the spin-on method, and the burying substance 82 in a portion other than the gaps 81 is removed by lithography. The use of the spin-on method allows facilitation of etching of a burying substance (e.g., $SiO_2$) 82 in the subsequent step.

A bonding layer 83 is formed on the structure ST, and a reinforcing layer 84 is formed on the bonding layer 83. The bonding layer 83 is made of a soft metal containing, for example, Sn or In as a major component. The reinforcing layer 84 is made of a metal.

A reinforcing layer 84 may be formed on the structure ST to have a thickness greater than or equal to a predetermined thickness by sputtering without forming a bonding layer 83.

Figure 7A:
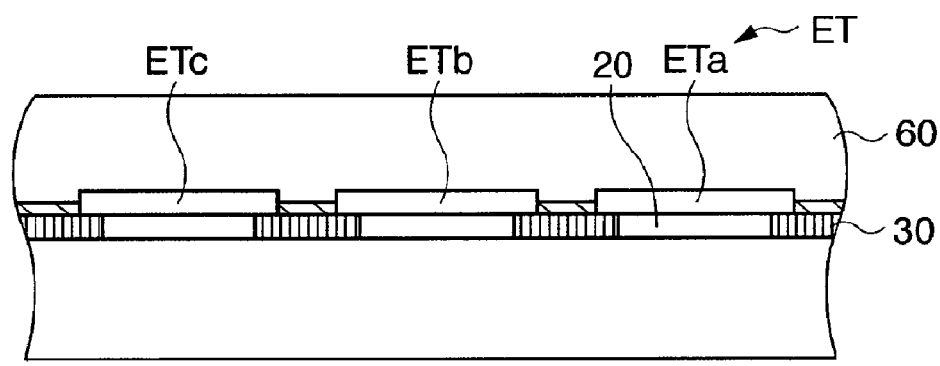
FIGS. 7A to 7C are sectional views showing the steps of the device manufacturing method according to the first embodiment of the present invention.
Figure 7B:
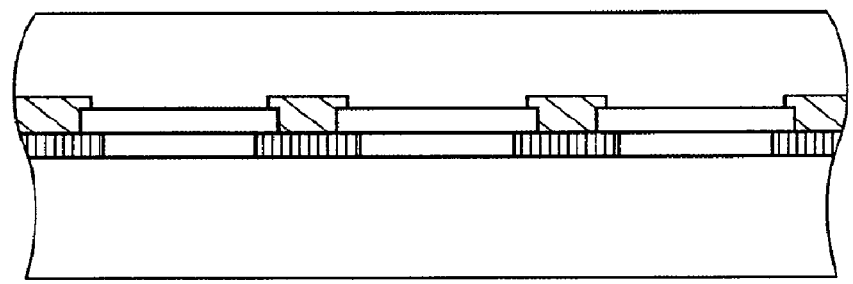
Figure 7C:
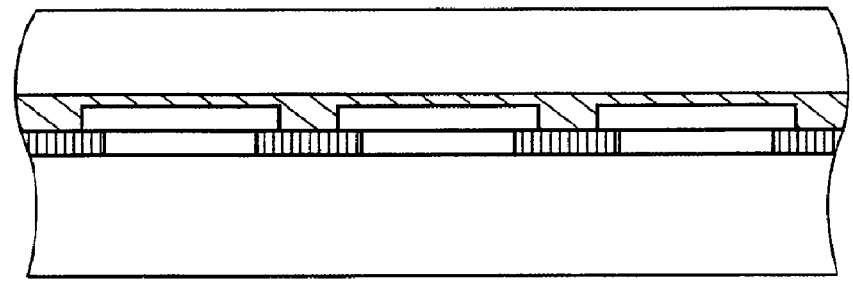

In step S6 of FIG. 1, the mask pattern 40 is selectively etched using a first etchant for the mask pattern 40 to form channels ET, that is, ETa, ETb, ETc, . . . to supply a second etchant for the chromium nitride film 30 to it (see FIGS. 7A to 7C). Also, the burying substance 82 (see FIG. 9D) is selectively etched to re-form gaps 81 to supply an etchant for the peeling buffer layer to it (see FIG. 10A).

The etching rate of the mask pattern 40 for the first etchant is higher than those of the underlying substrate 10, chromium film 20, chromium nitride film 30, and crystal member 60 for the first etchant. The etching selectivity is preferably greater than or equal to 10. At least the crystal member is preferably almost insoluble.

For example, when the mask pattern 40 contains at least one of $SiO_2$, $SiN_x$, $SiO_xN_y$, Si, and a mixture thereof, the first etchant is preferably a hydrofluoric acid solution.

Figure 8A:
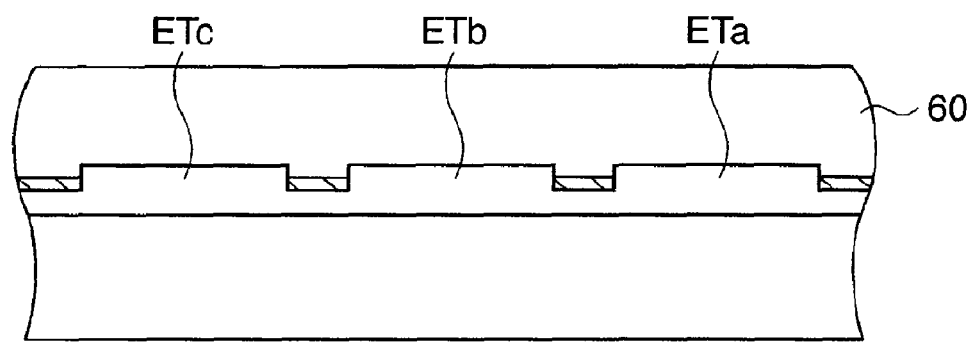
FIGS. 8A to 8C are sectional views showing the steps of the device manufacturing method according to the first embodiment of the present invention.
Figure 8B:
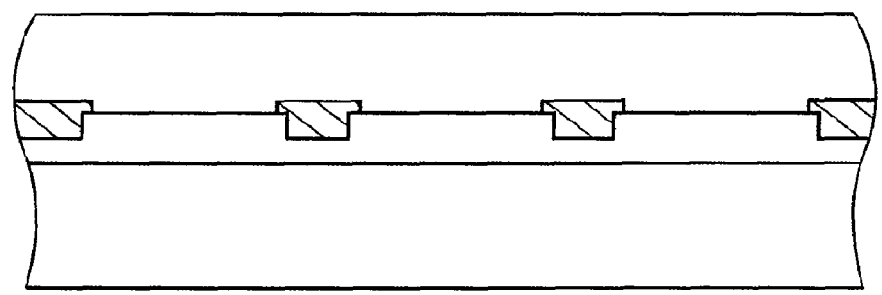
Figure 8C:
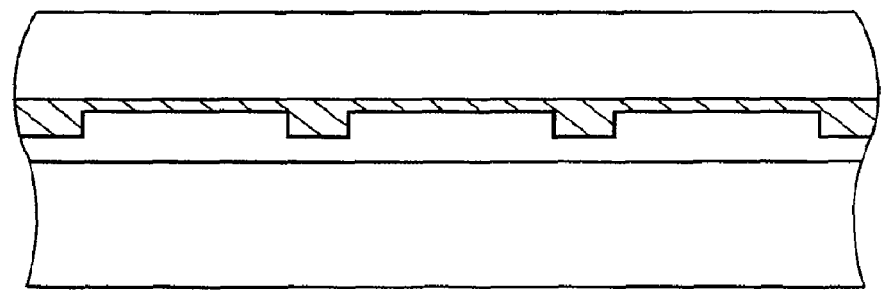

In step S7 of FIG. 1, the chromium film 20 and the chromium nitride film 30 are supplied with a second etchant through the channels ET, that is, ETa, ETb, ETc, . . . , and are selectively etched, thereby separating the initial growth layer 50 and the crystal members 60 from the underlying substrate 10 (see FIGS. 8A to 8C). At this time, since the plurality of crystal members 60 are held by the bonding layer 83 and the reinforcing layer 84 through the electrodes 90, they do not scatter upon the separation from the underlying substrate 10 (see FIG. 10B).

The etching rates of the chromium film 20 and chromium nitride film 30 for the second etchant are higher than those of the underlying substrate 10 and crystal member 60 for the second etchant. The etching selectivity is preferably greater than or equal to 10. At least the crystal member is preferably almost insoluble.

The second etchant is preferably a mixed solution of perchloric acid ($HClO_4$) and cerium (IV) ammonium nitrate ($Ce(NH_4)_2(NO_3)_6$).

A mask layer 85 is formed so as to cover the lower surface of the initial growth layer 50 and the gaps 81 by the spin-on method. Openings 85a are formed in portions, where electrodes are to be formed, in the mask layer 85 (see FIG. 10C). The mask layer 85 is made of a low-viscosity substance such as $SiO_2$.

Figure 10A:
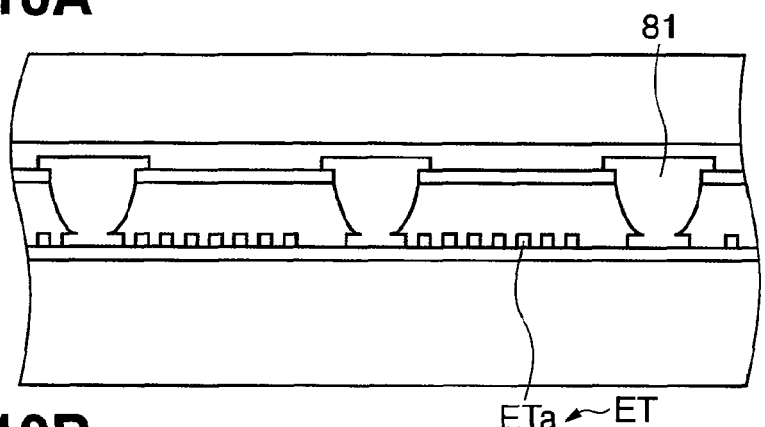
FIGS. 10A to 10D are sectional views showing the steps of the device manufacturing method according to the first embodiment of the present invention.
Figure 10B:
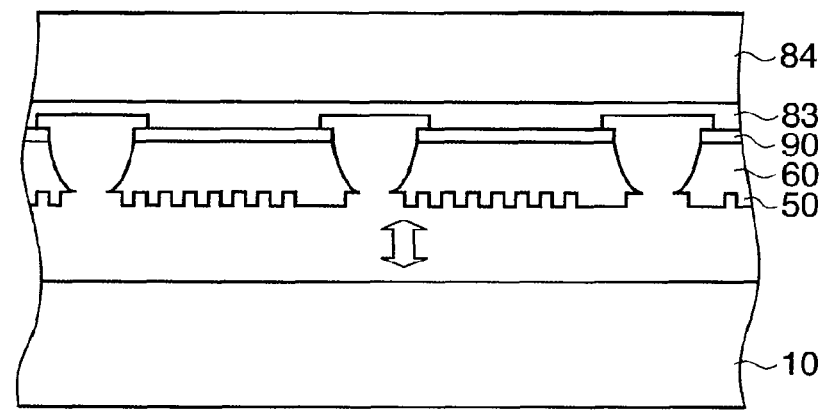
Figure 10C:
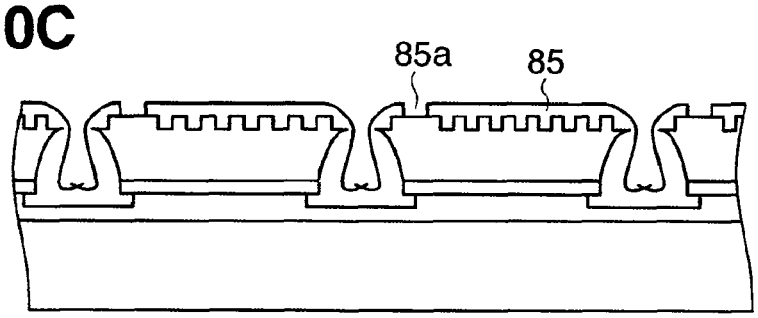
Figure 10D:
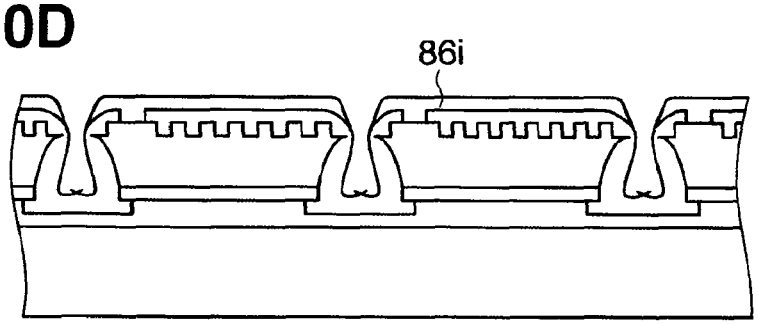
Figure 11:
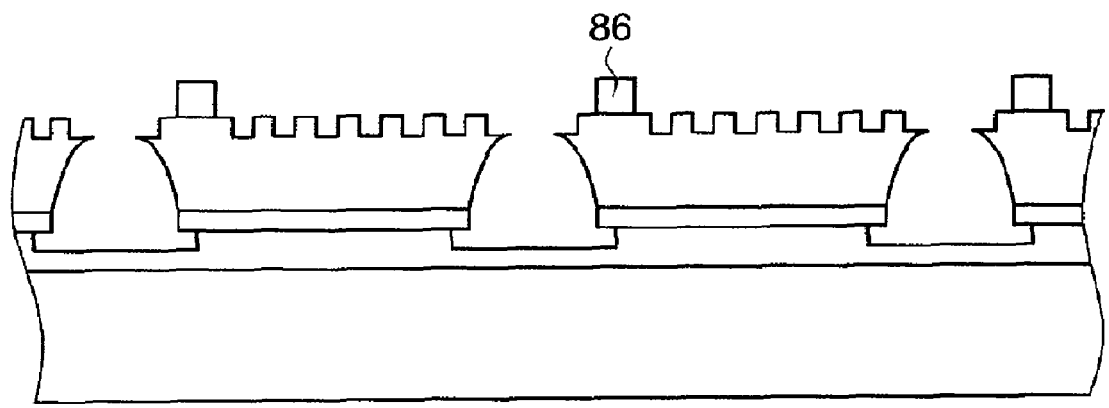
FIG. 11 is a view showing the step of the device manufacturing method according to the first embodiment of the present invention.

An electrode layer 86i to serve as electrodes is formed so as to cover the mask layer 85 by vapor deposition or sputtering (see FIG. 10D).

The mask layer 85 is etched by an etchant. A portion other than the openings 85a in the electrode layer 86i lifts off to form electrodes 86 in predetermined portions on the lower surface of the initial growth layer 50.

The bonding layer 83 and the reinforcing layer 84 are etched by an etchant. With this operation, the initial growth layer 50 and the crystal member 60 are separated from each other. This makes it possible to obtain the initial growth layer 50 and the crystal member 60 as a chip-size device.

As mentioned above, in etching the peeling buffer layer (the chromium film 20 and the chromium nitride film 30) between the underlying substrate 10 and the initial growth layer 50 and each of the plurality of crystal members 60, an etchant can be supplied to the peeling buffer layer not only sideways but also from above through the channels ET. This makes it possible to shorten the etching time of the peeling buffer layer in manufacturing a device made of a group III nitride crystal member.

An experiment example using a device manufacturing method according to the first embodiment of the present invention will be described next.

In an experiment example of the present invention, the processes in steps S1 to S7 of FIG. 1 were performed to separate an initial growth layer 50 and a crystal member 60 from an underlying substrate 10 as a chip-size device.

More specifically, one fourth of a 2-inch substrate was prepared as an underlying substrate 10, the processes in steps S1 to S5 were performed, and a mask pattern 40 having a thickness of 300 nm in a 1.0 mm×1.0 mm chip region was etched using a fluoric acid solution. The etching time of the mask pattern 40 was 1 hour. After that, a 20-nm chromium film 20 and chromium nitride film 30 were etched for 3 hours using a mixed solution of perchloric acid ($HClO_4$) and cerium (TV) ammonium nitrate ($Ce(NH_4)_2(NO_3)_6$). As a consequence, the rate of etching sideways was 830 µm/h.

In a comparative example, steps S1, S3 to S5, and S7 in FIG. 1 were performed to separate an initial growth layer 50 and a crystal member 60 from an underlying substrate 10.

More specifically, one fourth of a 2-inch substrate was prepared as an underlying substrate 10, and a peeling buffer layer (a chromium film and a chromium nitride film), an initial growth layer 50, and a crystal member 60 were sequentially formed on the underlying substrate 10 for each 1.0 mm×1.0 mm chip region without forming a mask pattern 40 (i.e., without forming channels to etch the peeling buffer layer). After that, a 20-nm chromium film 20 and chromium nitride film 30 were etched for 3 hours using a mixed solution of perchloric acid ($HClO_4$) and cerium (IV) ammonium nitrate ($Ce(NH_4)_2(NO_3)_6$). As a consequence, the rate of etching sideways was 50 to 70 µm/h.

In this manner, the use of the technique according to this embodiment makes it possible to shorten the etching time of the peeling buffer layer in manufacturing a substrate made of a group III nitride crystal member to (50 to 70 µm/h)≈(830 µm/h)≈(1/17 to 1/12), as compared to a case in which no channels to etch the peeling buffer layer are formed.

Figure 12:
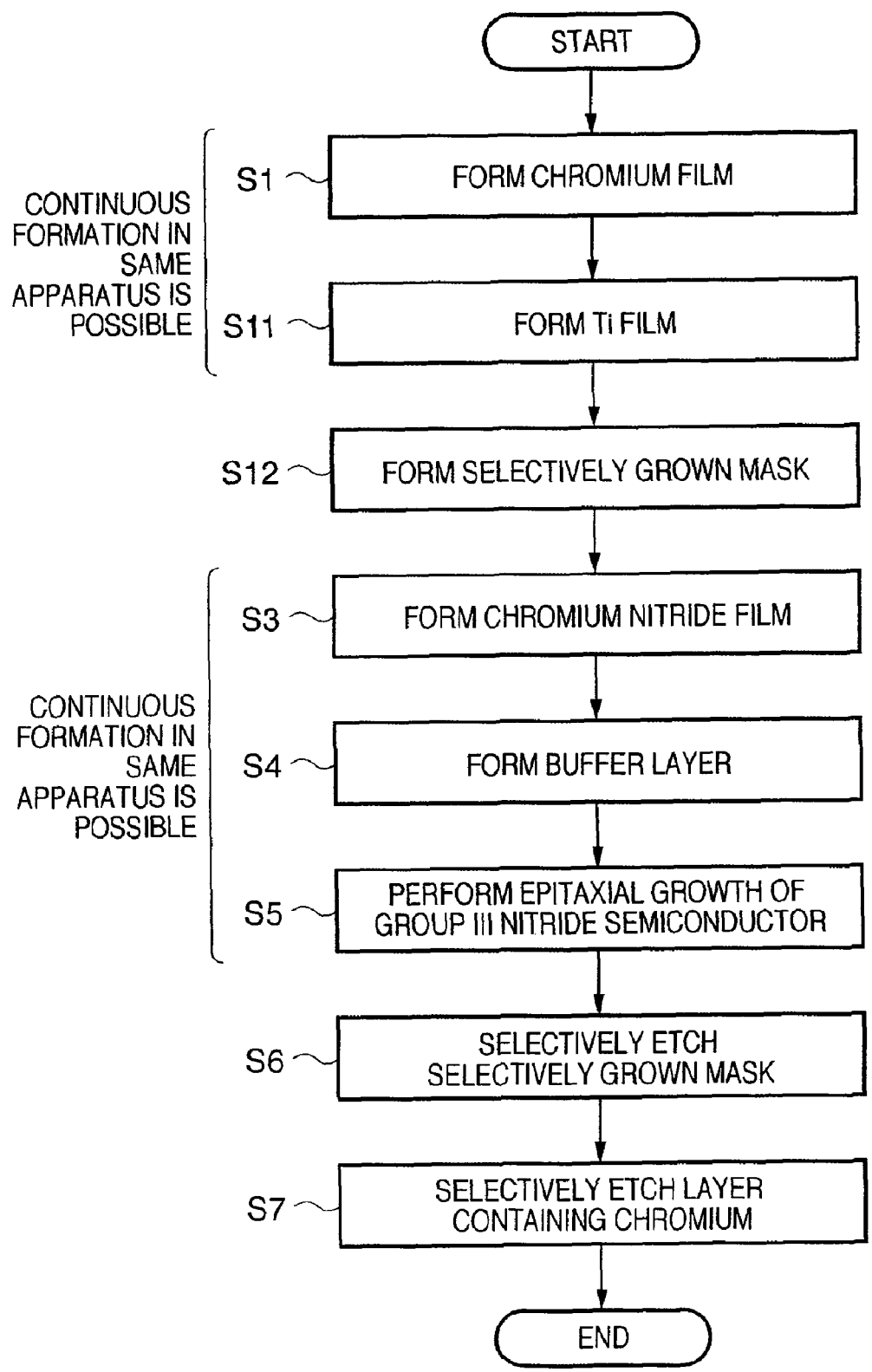
FIG. 12 is a flowchart illustrating a device manufacturing method according to a modification of the first embodiment of the present invention.
Figure 13A:
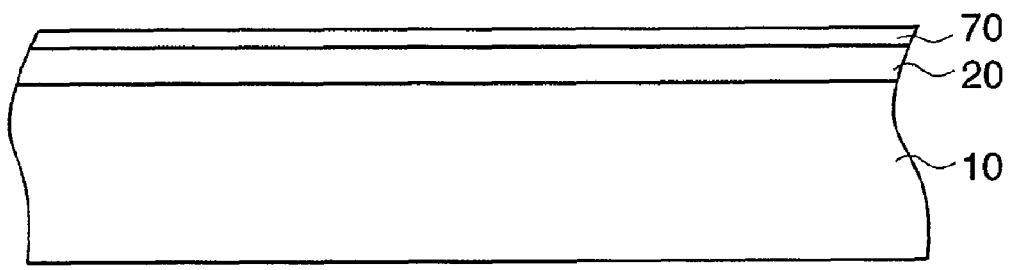
FIGS. 13A and 13B are sectional views showing the steps of the device manufacturing method according to the modification of the first embodiment of the present invention.
Figure 13B:
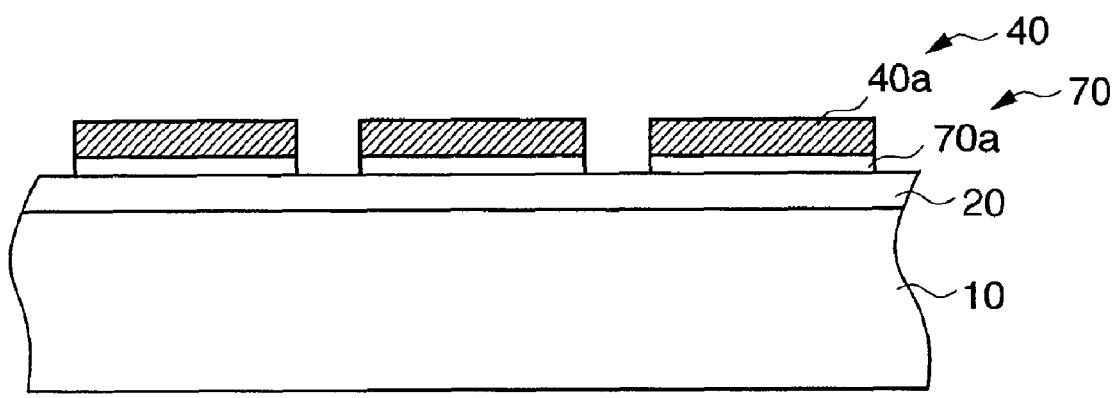

The device manufacturing method according to the first embodiment may further include, between steps S1 and S3 in FIG. 1, step S11 to form a Ti film 70. In step S11 of FIG. 12, a Ti film 70 is formed on the chromium film 20, as shown in FIG. 13A. In step S12 subsequent to step S11, a mask layer to serve as a mask pattern 40 is formed on the Ti film 70. As shown in FIG. 13B, in forming a mask pattern 40 by patterning the mask layer, the Ti film 70 in a portion which is not covered with the mask pattern 40 is removed to form, on the Ti film 70, line portions 70a, . . . having a shape similar to that of the line portions 40a, . . . . In this case, the Ti film 70 can be etched using a fluoric acid solution. When a Ti film 70 is formed between the mask pattern 40 and the chromium film 20 as in this case, it is possible to prevent the surface of the chromium film 20 from being oxidized when forming a mask pattern 40 using $SiO_2$. This makes it possible to obtain a chromium nitride film 30 having a good crystallinity in step S3 subsequent to step S12, and to perform the initial growth of the initial growth layer in step S4. As a consequence, in step S5 the crystal member 60 easily merges while its crystal orientations are uniform as it grows sideways (in the case of FIG. 5A or 5B).

Figure 14:
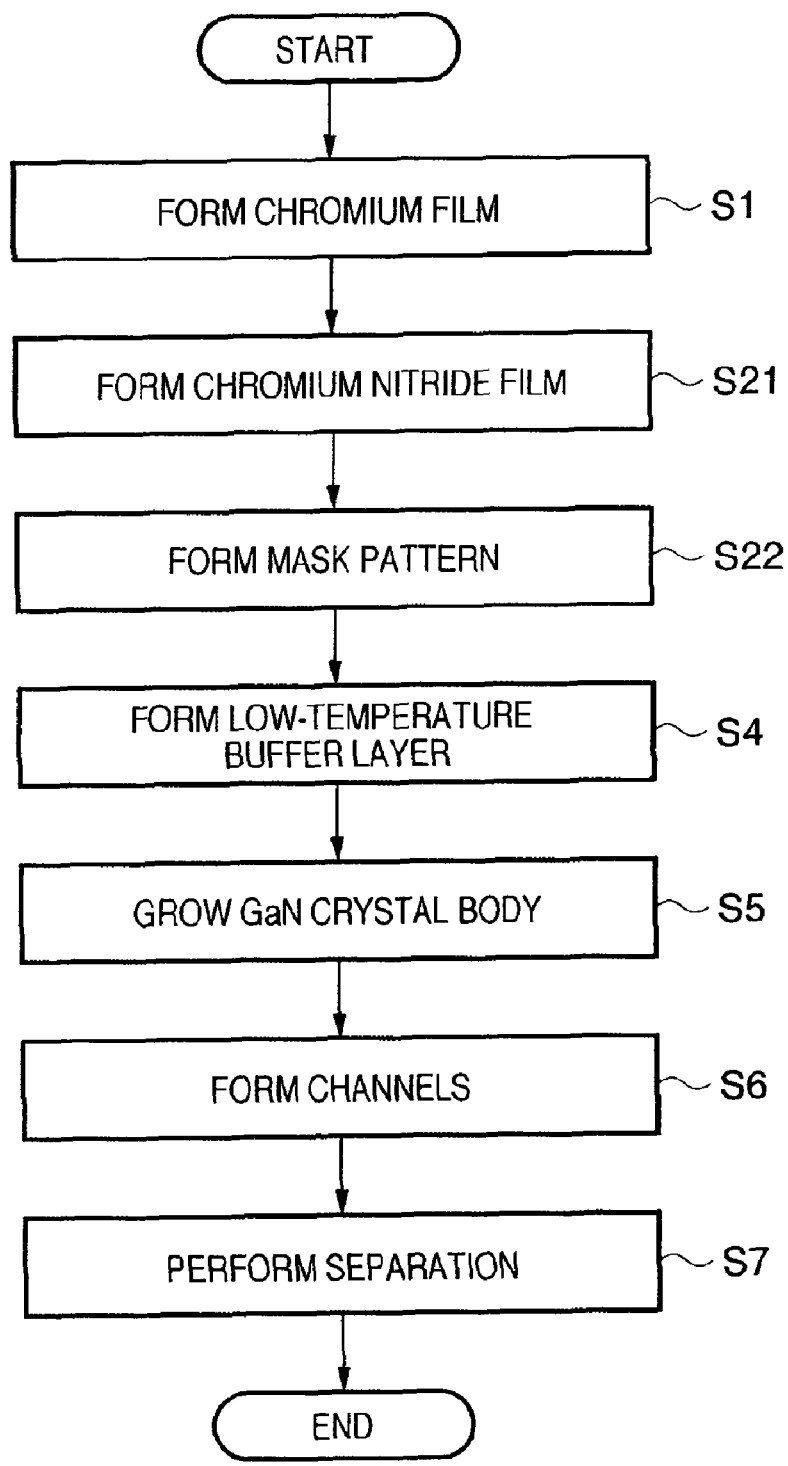
FIG. 14 is a flowchart illustrating a device manufacturing method according to the second embodiment of the present invention.
Figure 15A:
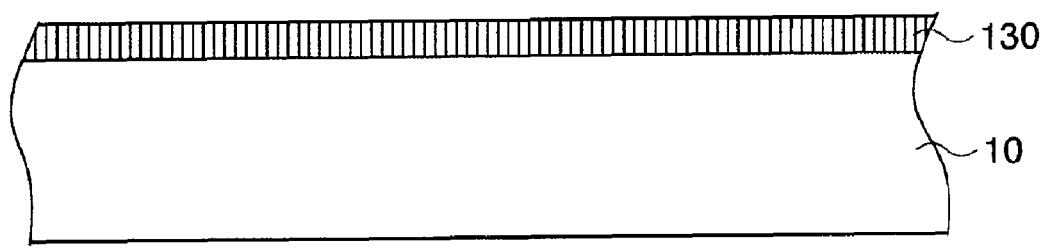
FIGS. 15A and 15B are sectional views showing the steps of the device manufacturing method according to the second embodiment of the present invention.
Figure 15B:
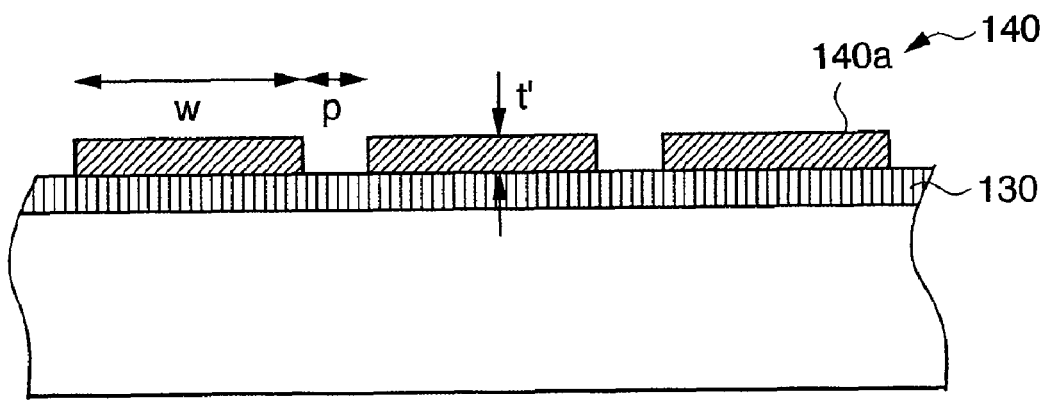
Figure 16:
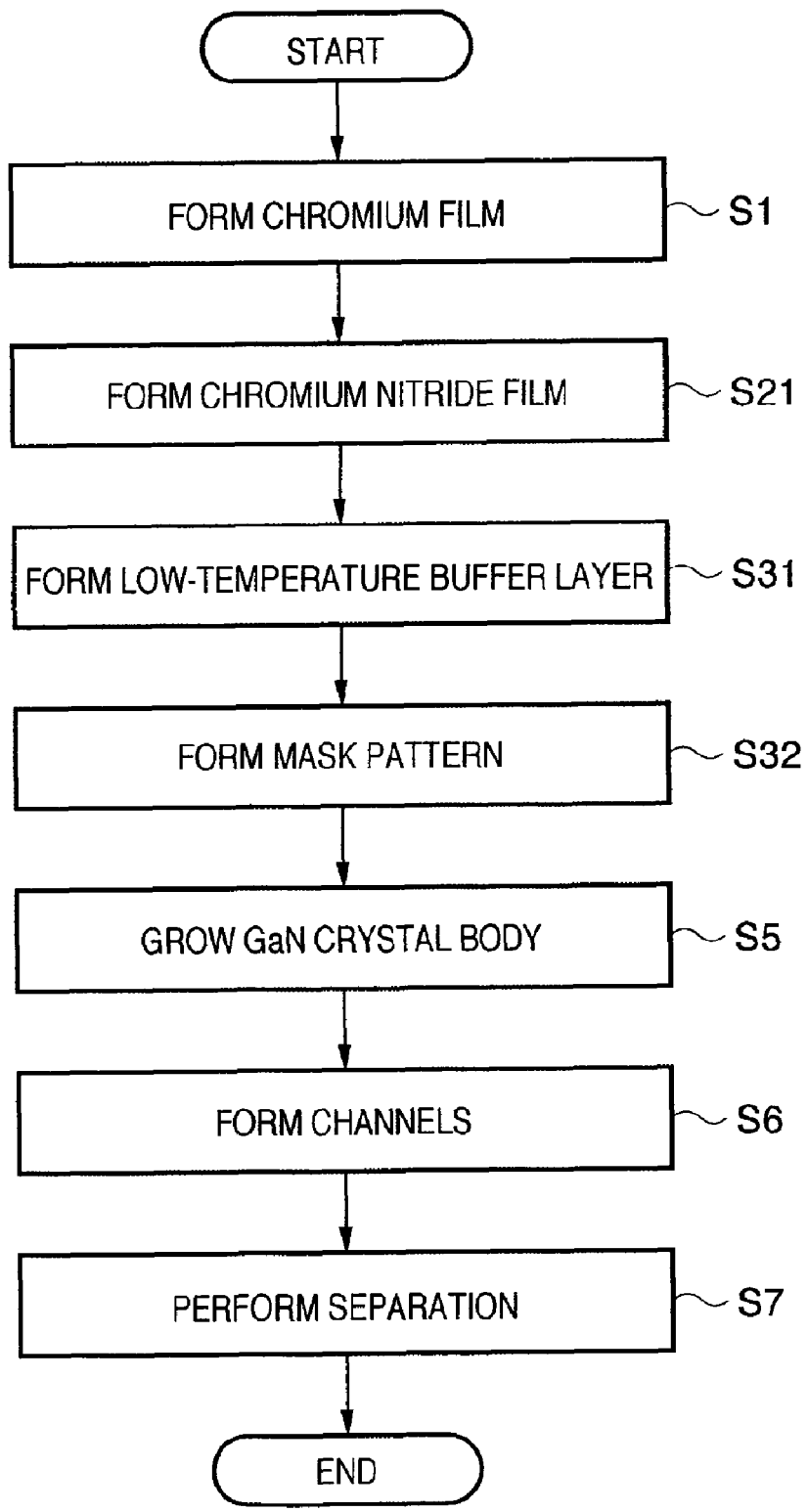
FIG. 16 is a flowchart illustrating a device manufacturing method according to a modification of the second embodiment of the present invention.
Figure 17A:
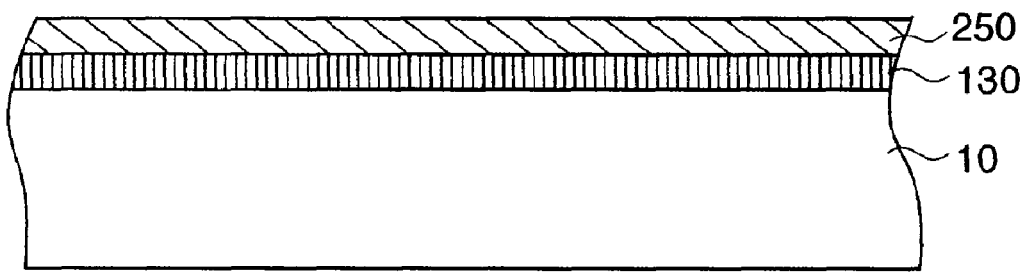
FIGS. 17A and 17B are sectional views showing the steps of the device manufacturing method according to the modification of the second embodiment of the present invention.
Figure 17B:
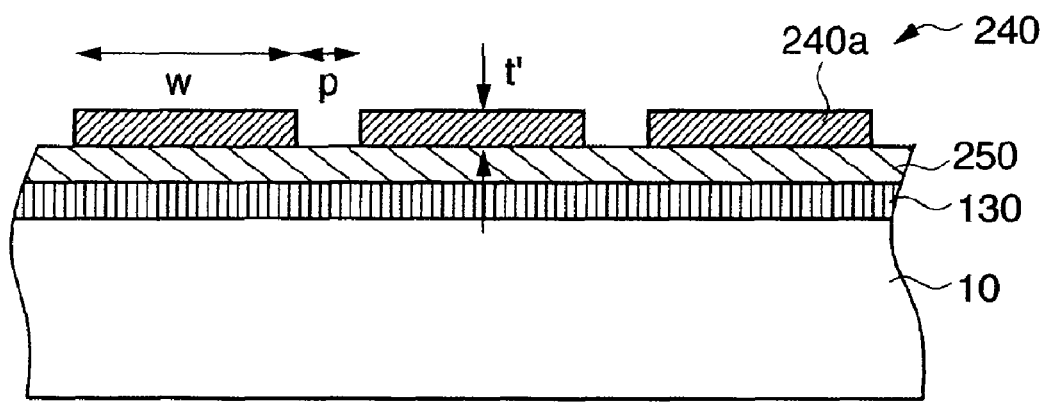

A device manufacturing method according to the second embodiment will be described next with reference to FIGS. 14, 15A, and 15B. FIG. 14 is a flowchart illustrating the device manufacturing method according to the second embodiment of the present invention. FIGS. 15A and 15B are sectional views showing the steps of the device manufacturing method according to the second embodiment of the present invention. Points different from those in the first embodiment will be mainly described below, and a description of the same points will not be given.

The device manufacturing method according to the second embodiment of the present invention includes steps S21 and S22 between steps S1 and S4.

In step S21, a chromium film 20 is nitrided to form a chromium nitride film 130. Note that the entire upper surface of the chromium film 20 is nitrided to a chromium nitride film 130 (see FIG. 15A).

In step S22 of FIG. 14, a mask pattern 140 which partially covers the chromium nitride film 130 is formed on the chromium nitride film 130 (see FIG. 15B).

A thickness t of the mask pattern 140 is preferably 0.15 to 1.1 µm and, more preferably, 0.2 to 0.6 µm. The thickness t' is preferably large in order to shorten the etching time of the peeling buffer layer. However, if the thickness t' is too large, the film often peels off during nitridation or growth.

In this manner, nitriding the chromium film 20 before forming a mask pattern 140 makes it possible to simplify the overall substrate manufacturing method, and to improve the separation time of the peeling buffer layer and the qualitative reproducibility of the crystal members.

The device manufacturing method according to the second embodiment of the present invention may include steps S31 and S32 between steps S21 and S5.

In step S31, an initial growth layer 250 is formed on the chromium nitride film 130.

In step S32, mask patterns 240, that is, 240a, . . . are formed on the initial growth layer 250 so as to partially cover the initial growth layer 250.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-072199, filed Mar. 19, 2008, which is hereby incorporated by reference herein in its entirety.

What is claimed is:

1. A device manufacturing method comprising:
 a peeling buffer layer forming step of forming a peeling buffer layer on an underlying substrate;
 a mask pattern forming step of forming, on the peeling buffer layer, a mask pattern which partially covers the peeling buffer layer;
 a growth step of growing a group III nitride crystal from regions exposed by the mask pattern on a surface of the peeling buffer layer, thereby forming a structure in which a plurality of crystal members are arranged with gaps therebetween so as to partially cover the peeling buffer layer and the mask pattern;
 a channel forming step of forming a channel, to supply a second etchant for the peeling buffer layer to the peeling buffer layer, by selectively etching the mask pattern using a first etchant for the mask pattern; and a separation step of separating the plurality of crystal members from the underlying substrate and separating the plurality of crystal members from each other by supplying the second etchant to the peeling buffer layer through the gaps and the channel and selectively etching the peeling buffer layer.

2. The method according to claim 1, wherein,
in the mask pattern forming step, the mask pattern is formed so as to partially cover regions in which the plurality of crystal members are to be formed, and
in the channel forming step, the channel is formed so that at least a part of the channel extends between the peeling buffer layer and each of the plurality of crystal members.

3. The method according to claim 1, wherein,
in the growth step, the structure is formed by growing the plurality of crystal members with the gaps therebetween from the regions exposed by the mask pattern on the surface of the peeling buffer layer.

4. The method according to claim 1, wherein the growth step includes steps of
growing a group III nitride crystal layer to be formed into the plurality of crystal members from the regions, which are exposed by the mask pattern on the surface of the peeling buffer layer, so as to cover the peeling buffer layer and the mask pattern, and
forming the structure by selectively removing a part of the crystal layer so as to form the gaps.

5. The method according to claim 1, further comprising, between the mask pattern forming step and the growth step, a nitridation step of nitriding the regions exposed by the mask pattern on the surface of the peeling buffer layer, thereby partially changing the peeling buffer layer to a second peeling buffer layer,
wherein the peeling buffer layer contains a metal,
the second peeling buffer layer contains a metal nitride, and
in the separation step, the plurality of crystal members are separated from the underlying substrate by supplying the second etchant to the peeling buffer layer and the second peeling buffer layer through the gaps and the channel, and selectively etching the peeling buffer layer and the second peeling buffer layer.

6. The method according to claim 5, wherein
an etching rate of the mask pattern for the first etchant is higher than etching rates of the underlying substrate, the peeling buffer layer, the second peeling buffer layer, and the crystal member for the first etchant, and etching rates of the peeling buffer layer and the second peeling buffer layer for the second etchant are higher than etching rates of the underlying substrate and the crystal member for the second etchant.

7. The method according to claim 1, wherein,
in the peeling buffer layer forming step, a metal layer is formed on the underlying substrate before the mask pattern forming step, and the metal layer is nitrided to form the peeling buffer layer of a metal nitride.

8. The method according to claim 1, wherein
the peeling buffer layer forming step includes
a metal layer forming step of forming a metal layer on the underlying substrate, and
a nitridation step of nitriding the metal layer to form the peeling buffer layer of a metal nitride.

9. The method according to claim 7, wherein
an etching rate of the mask pattern for the first etchant is higher than etching rates of the underlying substrate, the peeling buffer layer, and the crystal member for the first etchant, and
an etching rate of the peeling buffer layer for the second etchant is higher than etching rates of the underlying substrate and the crystal member for the second etchant.

10. The method according to claim 1, further comprising, between the growth step and the channel forming step, a burying step of burying the gaps with a burying substance,
wherein in the channel forming step, the burying substance is selectively etched to re-form the gaps to supply an etchant for the peeling buffer layer.

11. The method according to claim 10, wherein
an etching rate of the burying substance for the first etchant is higher than etching rates of the underlying substrate, the peeling buffer layer, and the crystal member for the first etchant.

12. The method according to claim 3, further comprising, between the growth step and the channel forming step, an etching step of etching ends of each of the plurality of crystal members.

13. The method according to claim 1, further comprising, between the growth step and the separation step, a step of forming a bonding layer on the structure and forming a reinforcing layer on the bonding layer,
wherein, in the separation step, the plurality of crystal members are separated from the underlying substrate and separated from each other by removing the bonding layer and the reinforcing layer after selectively etching the peeling buffer layer.

* * * * *

UNITED STATES PATENT AND TRADEMARK OFFICE
CERTIFICATE OF CORRECTION

PATENT NO. : 7,906,409 B2
APPLICATION NO. : 12/405696
DATED : March 15, 2011
INVENTOR(S) : Takafumi Yao and Meoung-Whan Cho It is certified that error appears in the above-identified patent and that said Letters Patent is hereby corrected as shown below:

On the Title Page, item (73) Assignee: Canon Kabushiki Kaisha, Tokyo (JP)

delete "Assignee: Canon Kabushiki Kaisha, Tokyo (JP)"

and insert -- Assignees: Tohoku Techno Arch Co., Ltd., Sendai-shi, Miyagi-ken (JP); Furukawa Co., Ltd., Tokyo (JP); Dowa Holdings Co., Ltd., Tokyo (JP); Wavesquare Inc., Yongin-City, Gyeonggi-Do (KR) --

Signed and Sealed this
Fifth Day of July, 2011

David J. Kappos
*Director of the United States Patent and Trademark Office*